(12) United States Patent
Kim et al.

(10) Patent No.: US 7,734,988 B2
(45) Date of Patent: Jun. 8, 2010

(54) METHOD FOR PUNCTURING A LOW DENSITY PARITY CHECK CODE

(75) Inventors: Dong-Ho Kim, Seoul (KR); Yung-Soo Kim, Seongnam-si (KR); Ye-Hoon Lee, Suwon-si (KR); Myeon-Gyun Cho, Seongnam-si (KR); Hyo-Yol Park, Seoul (KR); Keum-Chan Whang, Seoul (KR); Kwang-Soon Kim, Seoul (KR); Jae-Won Kang, Daegu (KR)

(73) Assignees: Samsung Electronics Co., Ltd (KR); Yonsei University (KR)

( * ) Notice: Subject to any disclaimer, the term of this patent is extended or adjusted under 35 U.S.C. 154(b) by 874 days.

(21) Appl. No.: 11/541,749

(22) Filed: Oct. 2, 2006

(65) Prior Publication Data

US 2007/0101243 A1     May 3, 2007

(30) Foreign Application Priority Data

Sep. 30, 2005    (KR) .......................... 2005-0092573

(51) Int. Cl.
*H03M 13/35*    (2006.01)
(52) U.S. Cl. ...................................... 714/774
(58) Field of Classification Search ................... 714/774
See application file for complete search history.

(56) References Cited

U.S. PATENT DOCUMENTS 7,222,284 B2 *   5/2007   Stolpman .................... 714/774
7,395,494 B2     7/2008   Lee et al.
7,519,895 B2 *   4/2009   Kyung et al. ................. 714/780

FOREIGN PATENT DOCUMENTS

EP           1653629 A1 *   5/2006
KR     102005006366     6/2005

OTHER PUBLICATIONS

Jaewon Kang et al., "Puncturing Method of LDPC Code Based on Girth Distribution" 2004.

* cited by examiner

*Primary Examiner*—Stephen M Baker
(74) *Attorney, Agent, or Firm*—The Farrell Law Firm, LLP

(57) ABSTRACT

A method for puncturing a Low Density Parity Check (LDPC). The method includes a) setting a codeword length and the total number of bit nodes to be punctured; b) selecting a check node (or check nodes) with highest priority excluding check nodes completely checked in a current round; c) selecting a bit node (or bit nodes) with a highest priority excluding bit nodes completely checked among bit nodes connected to the selected check node (or check nodes); d) determining whether the selected bit node is a bit node to be punctured, that is, it is not systematic, not set by a puncturing prohibition flag; e) puncturing an associated bit node if the selected bit node is the bit node to be punctured, setting unpunctured bit nodes connected to the selected check node by a puncturing prohibition flag, decreasing the number of remained bit nodes to be punctured by 1 and increasing the number of connected punctured node of associated check node by 1; f) determining whether the number of remaining bits to be punctured is greater than 0; and g) returning to step b) if the number of remaining bits to be punctured is greater than 0, and ending a puncturing process if the number of remaining bits to be punctured is not greater than 0.

9 Claims, 9 Drawing Sheets

Rate 1/2:

| -1 | 94 | 73 | -1 | -1 | -1 | -1 | 55 | 83 | -1 | -1 | 7  | 0  | -1 | -1 | -1 | -1 | -1 | -1 | -1 | -1 | -1 | -1 | -1 |
|----|----|----|----|----|----|----|----|----|----|----|----|----|----|----|----|----|----|----|----|----|----|----|----|
| -1 | 27 | -1 | -1 | -1 | 22 | 79 | -1 | -1 | 12 | -1 | 0  | 0  | -1 | -1 | -1 | -1 | -1 | -1 | -1 | -1 | -1 | -1 | -1 |
| -1 | -1 | -1 | 24 | 22 | 81 | -1 | -1 | 33 | -1 | -1 | -1 | 0  | 0  | -1 | -1 | -1 | -1 | -1 | -1 | -1 | -1 | -1 | -1 |
| 61 | -1 | 47 | -1 | -1 | -1 | -1 | 65 | -1 | -1 | 72 | -1 | -1 | 0  | 0  | -1 | -1 | -1 | -1 | -1 | -1 | -1 | -1 | -1 |
| -1 | -1 | 39 | -1 | -1 | -1 | 84 | -1 | 41 | -1 | 72 | -1 | -1 | -1 | 0  | 0  | -1 | -1 | -1 | -1 | -1 | -1 | -1 | -1 |
| -1 | -1 | -1 | -1 | 46 | 40 | -1 | -1 | 82 | -1 | 18 | 79 | -1 | -1 | -1 | 0  | 0  | -1 | -1 | -1 | -1 | -1 | -1 | -1 |
| -1 | 11 | 95 | 53 | -1 | -1 | 2  | -1 | 14 | -1 | -1 | -1 | -1 | -1 | -1 | -1 | 0  | 0  | -1 | -1 | -1 | -1 | -1 | -1 |
| 12 | -1 | 73 | -1 | 83 | 24 | -1 | -1 | 47 | -1 | -1 | 51 | -1 | -1 | -1 | -1 | -1 | 0  | 0  | -1 | -1 | -1 | -1 | -1 |
| -1 | -1 | -1 | -1 | -1 | 94 | -1 | 39 | -1 | 43 | 70 | 72 | -1 | -1 | -1 | -1 | -1 | -1 | 0  | 0  | -1 | -1 | -1 | -1 |
| -1 | -1 | 7  | 65 | -1 | -1 | -1 | -1 | 49 | 59 | -1 | -1 | -1 | -1 | -1 | -1 | -1 | -1 | -1 | 0  | 0  | -1 | -1 | -1 |
| 43 | -1 | -1 | -1 | 66 | -1 | -1 | 41 | -1 | -1 | -1 | 26 | 7  | -1 | -1 | -1 | -1 | -1 | -1 | -1 | -1 | 0  | 0  | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | 0  | 0  |

BLOCK PUNCTURING

FIG.6

METHOD FOR PUNCTURING A LOW DENSITY PARITY CHECK CODE

PRIORITY

This application claims priority under 35 U.S.C. §119 to an application filed in the Korean Intellectual Property Office on Sep. 30, 2005 and assigned Serial No. 2005-92573, the contents of which are incorporated herein by reference.

BACKGROUND OF THE INVENTION

1. Field of the Invention

The present invention generally relates to a Low Density Parity Check (LDPC) code, and more particularly to a method for puncturing an LDPC code.

2. Description of the Related Art

Because Low Density Parity Check (LDPC) codes have a superior performance and lower decoding complexity than turbo codes and can be processed in parallel at a high rate, they are attracting much interest as a coding scheme suitable for next generation communication systems.

The LDPC codes first proposed by Gallager in 1962 are defined as linear block codes using a parity check matrix H with a large number of 0's. The technology required to process the codes has not been actively implemented due to code complexity, and therefore the LDPC codes have been almost forgotten for a long time. Mackay and Neal have rediscovered the LDPC codes and have verified that they have a superior performance using a simple probabilistic decoding method.

The LDPC code is defined by a sparse random parity check matrix H with a small number of 1's. The parity check matrix H is used to determine whether a received codeword has been decoded normally. If a product of the decoded codeword and the parity check matrix H is 0, it is determined that no error has occurred. After the predetermined parity check matrix of an LDPC code is designed to produce zero when it is multiplied by any codeword, an encoding operation in an encoder of a transmitter is performed on the basis of the designed parity check matrix.

The parity check matrix H has the following structural characteristics. First, a weight k per row is uniformly constructed. Second, a weight j per column is constructed by the given distribution. Third, overlap between any two columns is made at random and is not greater than 1. Herein, the weight indicates the number of non-zero elements, i.e., the number of 1's. The overlap between two columns is their inner product. The weight of a row or column is much less than a code length. For this reason, the code are called as low density parity check codes.

Techniques capable of generating LDPC codes at various code rates are divided into two methods. The first method is designed such that parity check matrices with various code rates can be included in one main parity check matrix. This method generates the parity check matrices based on the various code rates suitable for constraints while generating the main parity check matrix. The LDPC codes generated from the above-described method can have superior performance, and a performance at each code rate can be predicted. However, this method can obtain only limited number of code rates and cannot be applied to full or partial Incremental Redundancy (IR) of an Hybrid Automatic Repeat Request (H-ARQ) system requiring the technology of combining code bits due to a mismatch between coded bit streams at various code rates.

The second method performs a puncturing process suitable for varying the code rate after an encoding process. After a transmitter performs the puncturing process in a puncturing pattern, a decoder of a receiver inserts a Log Likelihood ratio (LLR) value of 0 or a probability value of 0.5 into a punctured bit node. The puncturing process can easily generate a desired code rate and does not increase complexity in the encoding process. Moreover, the puncturing process can be applied to the H-ARQ technology as in a Rate Compatible Punctured Turbo (RCPT) scheme. However, a performance of the second method is inferior to that of the first method based on LDPC codes with an optimal parity check matrix at each code rate.

To overcome this drawback, a method for designating a puncturing distribution in an optimal parity check matrix with respect to existing irregular codes has been proposed. This method can designate puncturing ratios according to the degree distribution of bit nodes by using the density evolution technique. However, because this method is based on an asymptotic behavior under the assumption that a block length, a cycle length, and the number of iterative decoding processes are ideal, it is not useful for an actual system with a finite block length. Moreover, because a puncturing position is designated according to the degree distribution, the above-described method cannot be applied to regular codes. It is difficult to give a priority among bit nodes with the same node degree also in the irregular codes.

Another puncturing technique has been proposed which performs a puncturing process for LDPC codes with a finite length by grouping the same-step recoverable nodes. The group-wise puncturing process cannot be applied in a precise bit-wise puncturing. However, this puncturing technique only takes into consideration that an LLR of punctured bits is quickly filled from the point of view of a bit node, without taking into consideration information received from many check nodes.

On the other hand, another block-wise puncturing technique has been proposed which is suitable for an LDPC code with a dual diagonal parity structure. This puncturing technique can be applied to only the block LDPC code with a dual diagonal parity structure and performs the puncturing process without taking into consideration the degree of a bit node, such that the maximum number of punctured bit nodes connected to each check node cannot be not minimized.

SUMMARY OF THE INVENTION

Accordingly, the present invention has been designed to solve the above and other problems occurring in the prior art. Therefore, it is an aspect of the present invention to provide a method for puncturing a Low Density Parity Check (LDPC) code that can support various code rates in one code.

It is another aspect of the present invention to provide a method for puncturing a Low Density Parity Check (LDPC) code that can minimize performance degradation due to puncturing by using a new puncturing technique applicable in a wide range, regardless of the number of punctured bits for regular and irregular codes.

In accordance with an aspect of the present invention, there is provided a method for puncturing a Low Density Parity Check (LDPC) code that is expressed in a factor graph configured by a bit node and a check node connected to an edge and is configured in a systematic region and a parity region, including a) setting a codeword length and the total number of bit nodes to be punctured; b) selecting a check node (or check nodes) with highest priority excluding check nodes completely checked in a current round; c) selecting a bit node (or bit nodes) with a highest priority excluding bit nodes completely checked among bit nodes connected to the selected check node (or check nodes); d) determining whether the selected bit node is a bit node to be punctured, that is, it is not systematic, not set by a puncturing prohibition flag; e) puncturing an associated bit node if the selected bit node is the bit node to be punctured, setting unpunctured bit nodes connected to the selected check node by a puncturing prohibition flag, decreasing the number of remained bit nodes to be punctured by 1 and increasing the number of connected punctured node of associated check node by 1; f) determining whether the number of remaining bits to be punctured is greater than 0; and g) returning to step b) if the number of remaining bits to be punctured is greater than 0, and ending a puncturing process if the number of remaining bits to be punctured is not greater than 0.

BRIEF DESCRIPTION OF THE DRAWINGS

The above and other objects and aspects of the present invention will be more clearly understood from the following detailed description taken in conjunction with the accompanying drawings, in which:

FIG. 6 is a graph illustrating a puncturing pattern at a code rate 2/3 for an LDPC code (Dedicate A) designed at a code rate 1/2 in accordance with the present invention;

DETAILED DESCRIPTION OF THE PREFERRED EMBODIMENTS

Preferred embodiments of the present invention will be described in detail herein below with reference to the accompanying drawings such that those skilled in the art can readily implement the present invention.

In a Low Density Parity Check (LDPC) code puncturing method of the present invention, a desired mother code and the number of bits to be punctured, P, are set. On a bipartite graph for an LDPC code configured by check nodes and bit nodes connected thereto, values $C_m$ of puncturing counters for counting punctured bit nodes connected to each check node are initialized to 0 on a check node-by-check node basis. A round value R corresponding to an upper bound of puncturing counters for all check nodes is initialized to 0. In a pattern in which puncturing counter values of the check nodes are uniform, bit nodes mapped to the number of bits to be punctured, P, are punctured. From the point of view of the check nodes, the puncturing process is performed such that the number of connected punctured bit nodes is minimized. In the pattern in which puncturing counter values of the check nodes are uniform, details are as follows. After the Extrinsic Message Degree (EMD) of each bit node is computed, the puncturing process is performed from a bit node with the highest EMD and the minimum degree, The term EMD is proportional to information can be received from other independent bits.

Figure 1:
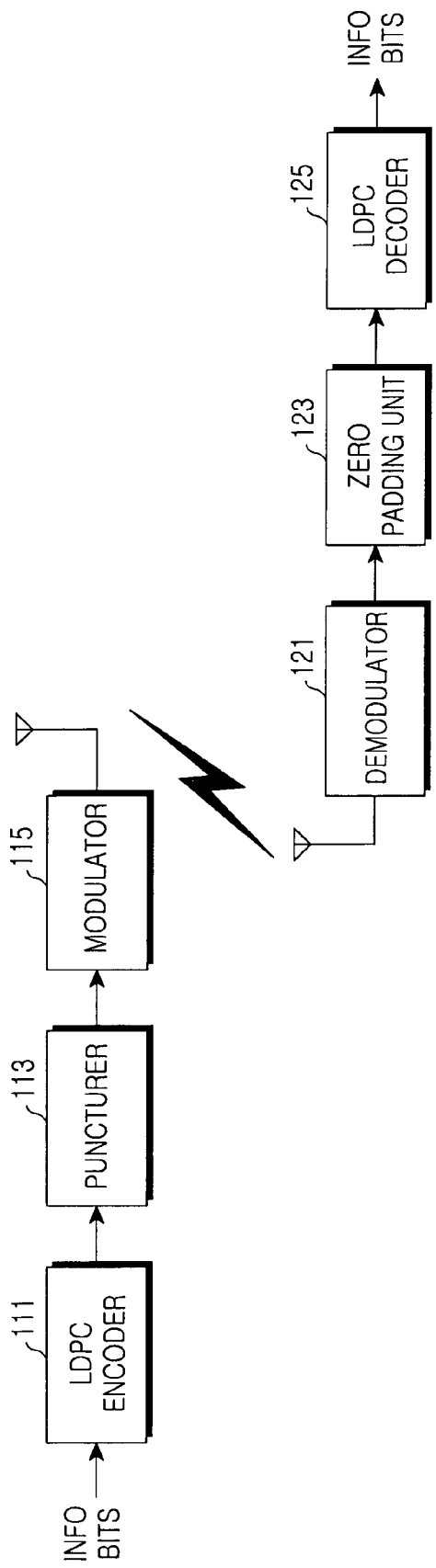
FIG. 1 illustrates a structure of a communication system based on Low Density Parity Check (LDPC) coding in accordance with the present invention.

FIG. 1 illustrates a structure of a communication system based on LDPC coding in accordance with the present invention.

As illustrated in FIG. 1, the LDPC coding-based communication system is provided with a transmitter and a receiver. The transmitter is provided with an LDPC encoder 111 for performing an LDPC coding process for input information bits, a puncturer 113 for puncturing the coded bits output from the LDPC encoder 111 according to a predefined puncturing pattern, and a modulator 115 for modulating the bits punctured in the puncturer 113 and transmitting the modulated punctured bits. The receiver is provided with a demodulator 121 for demodulating a signal received through an antenna in a demodulation scheme mapped to a modulation scheme applied to the modulator 115 of the transmitter, a zero padding unit 123 for inserting zero LLR values into bits demodulated in the demodulator 121 according to the puncturing pattern, and an LDPC decoder 125 for decoding a bit stream output from the zero padding unit 123.

The puncturing pattern used in the puncturer 113 is designed such that the maximum number of punctured bits connected to each check node can be minimized on a bipartite graph for an LDPC code, a bit node with the highest EMD and minimum bit degree is punctured, and a stopping set is not included in a punctured set.

Parameters for puncturing an LDPC code applied to the puncturer are defined as follows:

Parameters for m-th check nodes $F_m$: Check node index m (Ascending Order)

$C_m$: Number of connected punctured bit nodes $X_m$: Number of connected bit nodes set by a puncturing prohibition flag X $B_m$: Maximum value between $DC_n$ values of connected unpunctured bit nodes $S_m$: Number of connected unpunctured bit nodes $MD_m$: Minimum value between $D_n$ values of connected unpunctured bit nodes Parameters for n-th bit nodes $D_n$: Degree of the n-th bit node $SC_n$: Sum of $C_m$ values of connected check nodes $DC_n$: EMD value Other parameters P: Total number of bit nodes to be punctured p: Number of remaining bit nodes to be punctured R: Upper bound of $C_m$ FIG. 2 is a flowchart illustrating a puncturing method in accordance with the present invention.

Figure 2:
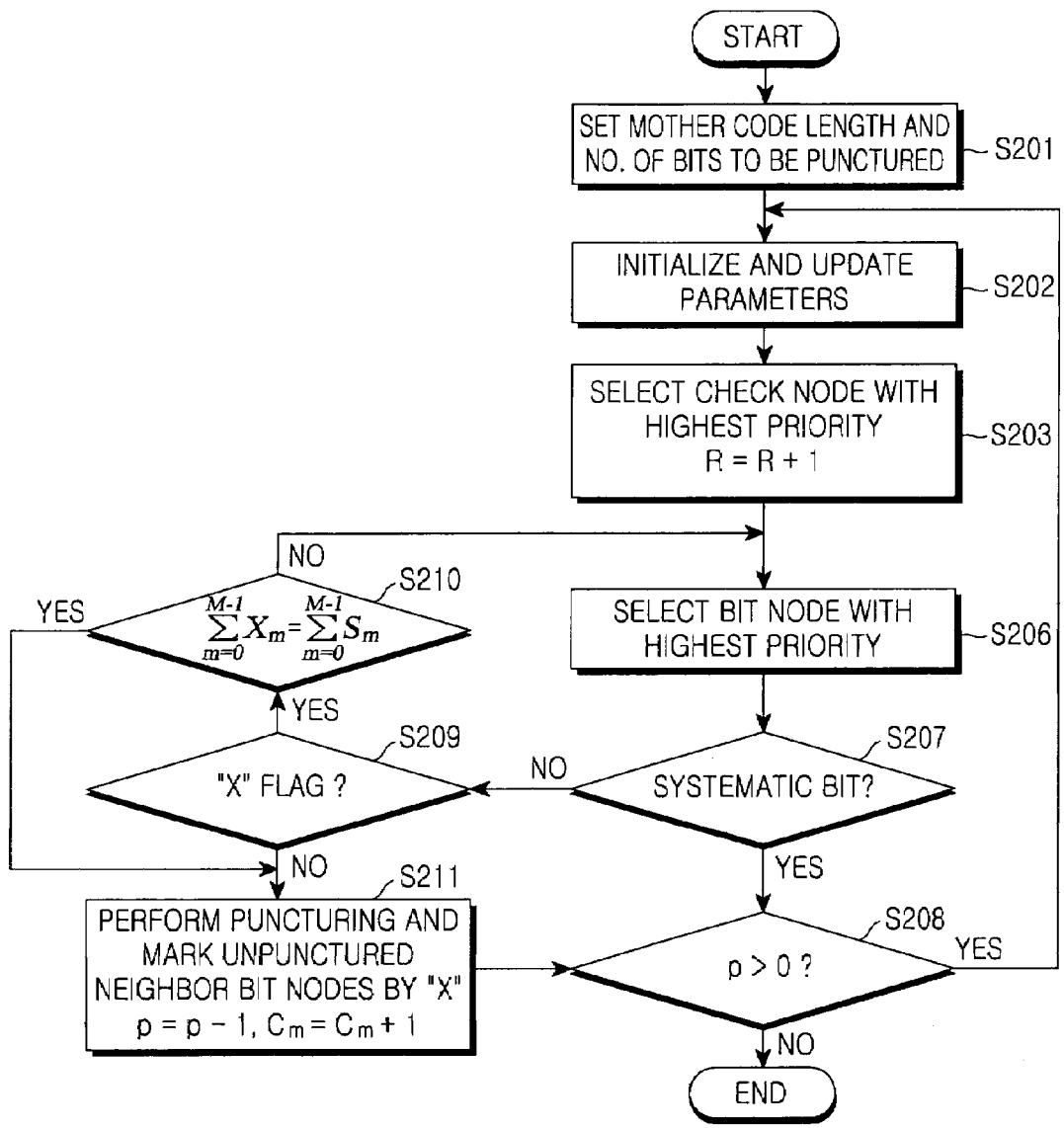
FIG. 2 is a flowchart illustrating a puncturing method in accordance with the present invention.

Referring to FIG. 2, in the puncturing method in accordance with the present invention, a length of a mother code to be punctured and the total number of bits to be punctured, P, for obtaining a desired code rate are set (S201). After that, all parameters are initialized (S202). That is, a check node index, $F_m$, as a parameter for the m-th check node is initialized to m. The number of connected punctured bits, $C_m$, is initialized to 0. The number of connected bits set by the puncturing prohibition flag X is initialized to 0. The maximum value $B_m$ between $DC_n$ values of connected unpunctured n-th bit nodes is initialized. The number of connected unpunctured bits, $S_m$, is initialized to the check node degree. The minimum value between the degrees of connected unpunctured bit nodes $MD_m$ is initialized. As a parameter for the n-th bit node, the degree $D_n$ of the n-th bit node is initialized. A sum of $C_m$ values of connected check nodes is initialized. The EMD value, $DC_n$, is initialized. The number of remaining bit nodes to be punctured, p, is initialized to P. An upper bound of $C_m$, R, is initialized to 0.

When all the parameters are completely initialized, a check node with the highest priority is selected from among all check nodes (S203).

When the check node is selected, a bit node with the highest priority is selected from among all bit nodes connected to the selected check node (S206). When the bit node is selected, a determination is made as to whether the selected bit node is a systematic bit (S207). If the selected bit node is the systematic bit node, a determination is made as to whether the number of remaining bit nodes to be punctured, p, is greater than 0 (S208). If p>0, a puncturing algorithm is repeated from a parameter update process for puncturing (S202). On the other hand, if the selected bit node is not the systematic bit node and the condition of p>0 is not satisfied, the puncturing algorithm is ended.

If the selected bit node is not the systematic bit node in step S207, a determination is made as to whether the puncturing prohibition flag X is set (S209). If the X flag is set, a determination is made as to whether a sum of $X_m$ is equal to a sum of $S_m$ with respect to all check nodes, i.e., $$\sum_{m=0}^{M-1} X_m = \sum_{m=0}^{M-1} S_m \quad (S210).$$

If the condition of $$\sum_{m=0}^{M-1} X_m = \sum_{m=0}^{M-1} S_m$$

is not satisfied, step 206 is performed for bit nodes except those bit nodes that have been completely checked from among the bit nodes connected to the current check node. On the other hand, if the condition of $$\sum_{m=0}^{M-1} X_m = \sum_{m=0}^{M-1} S_m$$

is satisfied, an associated bit node is punctured, all unpunctured bit nodes connected to an associated check node are set by the flag X (S211), p is decreased by 1 and $C_m$ of associated check node is increased by 1. Then, step 208 is performed.

Figure 3:
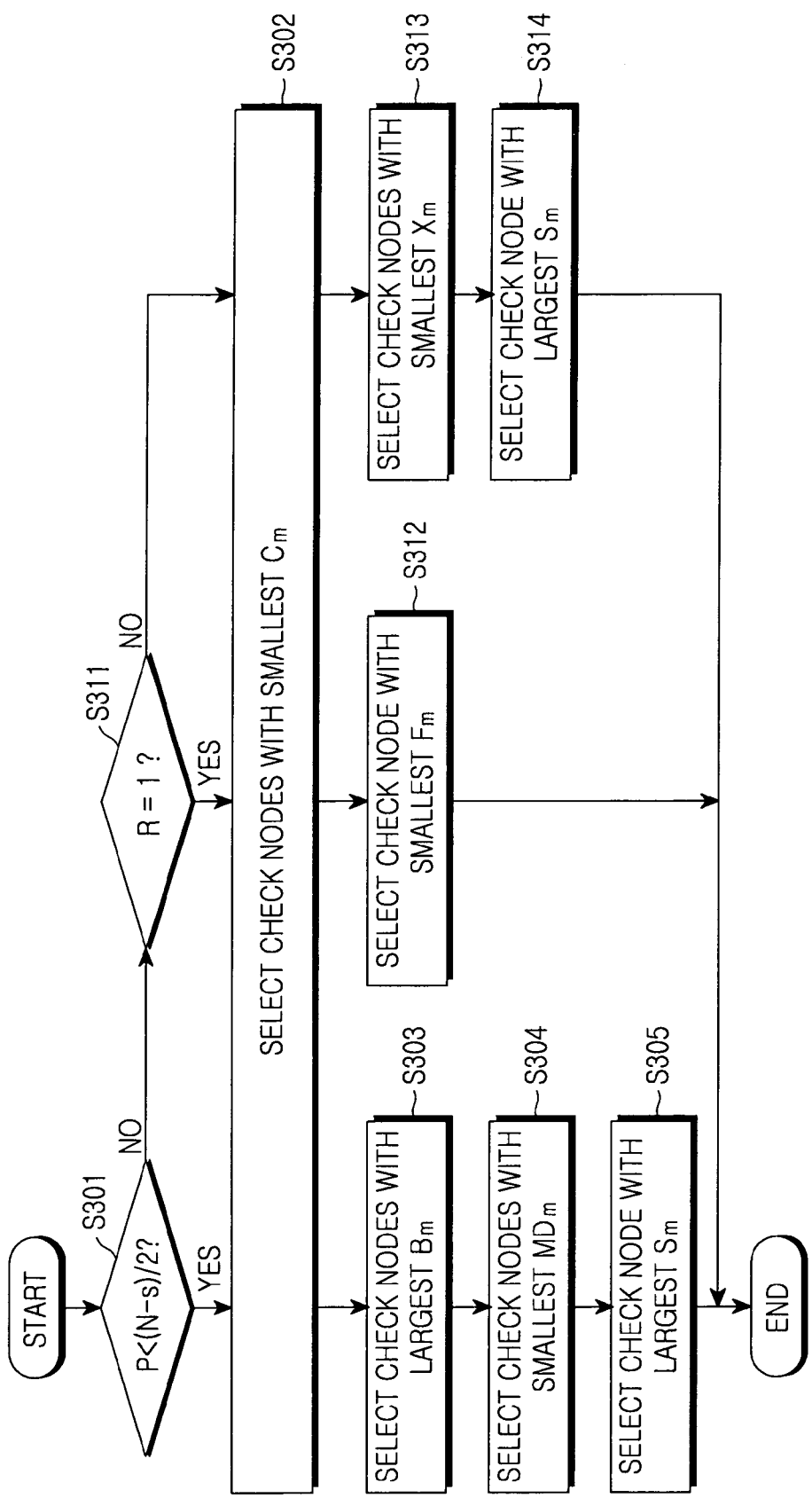
FIG. 3 is a flowchart illustrating a process for selecting a check node with the highest priority in FIG. 2.

FIG. 3 is a flowchart illustrating a process for selecting a check node with the highest priority in FIG. 2.

Referring to FIG. 3, to set a priority of a check node, the puncturer determines whether the total number of bits to be punctured, P, is less than the half of the number of total parity bits (N−s) (S301). Herein, N is the number of total coded bits and s is the number of information bits.

If the total number of bits to be punctured, P, is less than half of the number of bits of the total parity bits (N−s), a check node (or check nodes) with the smallest $C_m$ is selected (S302). A check node (or check nodes) with the largest $B_m$ is (are) selected from among the check nodes selected in the previous step (S303). Subsequently, a check node (or check nodes) with the smallest $MD_m$ is (are) selected from among the check nodes selected in the previous step (S304). A check node (or check nodes) with the largest $S_m$ is (are) selected among the selected check nodes (S305).

On the other hand, to set a priority of a check node in step S301, the puncturer determines whether a round counter R is 1 if the total number of bits to be punctured, P, is equal to or is greater than half of the number of bits of the total parity bits (N−s) (S311). If R=1, a check node (or check-nodes) with the smallest $C_m$ is (are) selected (S302), and a check node (or check nodes) with the smallest $F_m$ is (are) selected from among the selected check nodes (S312). On the other hand, if R≠1, a check node (or check nodes) with the smallest $C_m$ is (are) selected (S302), a check node (or check nodes) with the smallest $X_m$ is (are) selected from among the selected check nodes (S313) and a check node (or check nodes) with the largest $S_m$ is (are) selected from among the selected check nodes (S314).

Figure 4:
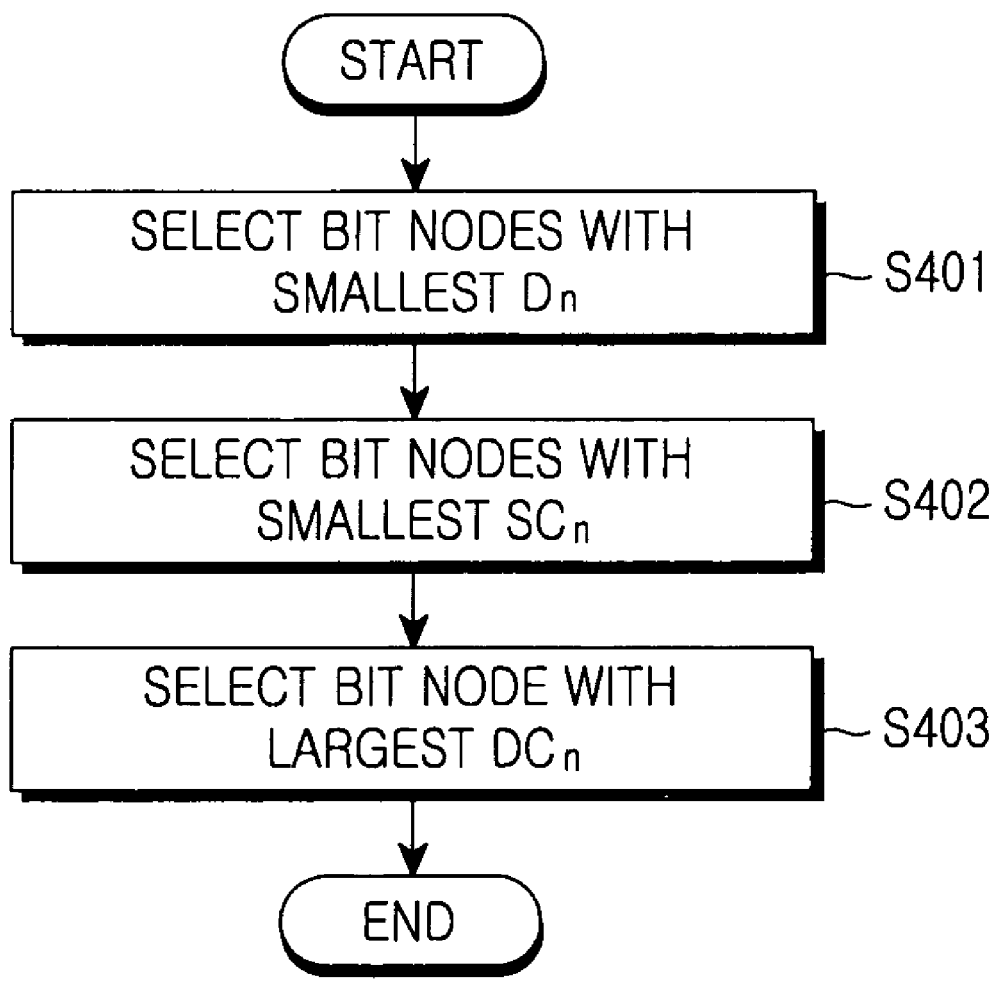
FIG. 4 is a flowchart illustrating a process for selecting a bit node with the highest priority in FIG. 2.

FIG. 4 is a flowchart illustrating a process for selecting a bit node with the highest priority in FIG. 2.

Referring to FIG. 4, when a check node is selected, the puncturer selects a bit node (or bit nodes) with the smallest $D_n$ from among bit nodes connected to the selected check node (S401), selects a bit node (or bit nodes) with the smallest $SC_n$ from among the selected bit nodes (S402), and selects a bit node (or bit nodes) with the largest $DC_n$ from among the selected bit nodes (S403).

Figure 5:
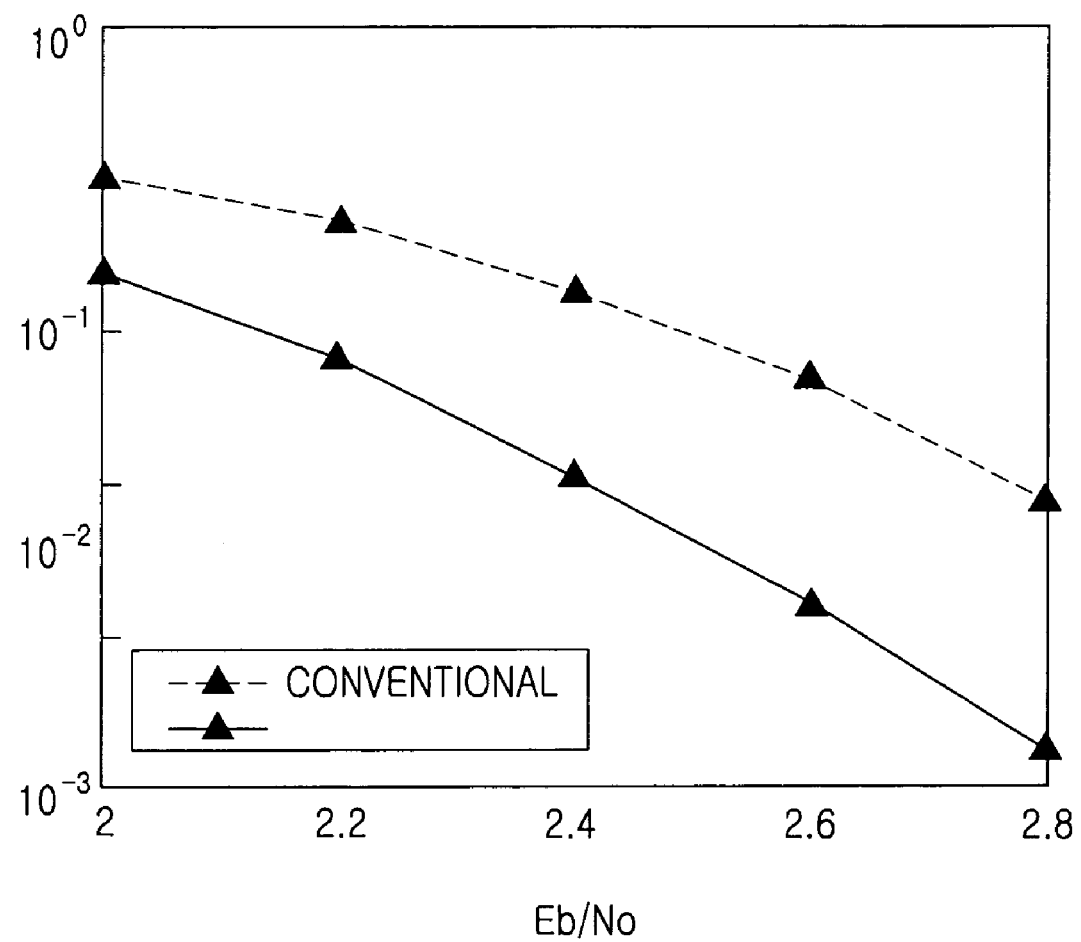
FIG. 5 is a graph illustrating performance simulation results of an irregular random LDPC code puncturing method in accordance with the present invention.

FIG. 5 is a graph illustrating performance simulation results of an LDPC code puncturing method in accordance with the present invention.

FIG. 5 illustrates a comparison between the puncturing method of the present invention and the conventional method based on puncturing distribution under the assumption that a length of a codeword is 2048 and an irregular code at a code rate 1/2 is used. The number of bits to be punctured is 512 and a code rate after puncturing is 2/3. As illustrated in FIG. 5, it can be seen that the performance of the puncturing method of the present invention is superior by about 0.3 dB at a frame error rate of 0.01 to that of the conventional method. Because the conventional method arbitrarily performs a puncturing process within a given puncturing rate, its efficiency is degraded.

FIG. 6 is a graph illustrating a puncturing pattern at a code rate 2/3 for an LDPC code (Dedicate A) designed at a code rate 1/2 in accordance with the present invention.

FIG. 6 illustrates a puncturing pattern from the code rate 1/2 to the code rate 2/3 using the puncturing method of the present invention on a parity check matrix. Only odd parity blocks are punctured using a merit of a dual diagonal form and a block form. From the point of view of a check node, only one bit is punctured due to a criterion of uniformity. The EMD criterion cannot be applied due to a priority of the criterion of uniformity. An excellent performance can be expected because a criterion of a stopping set is not violated. Because all punctured bit nodes are updated in one iterative decoding process, the performance degradation due to puncturing can be significantly reduced.

Figure 7:
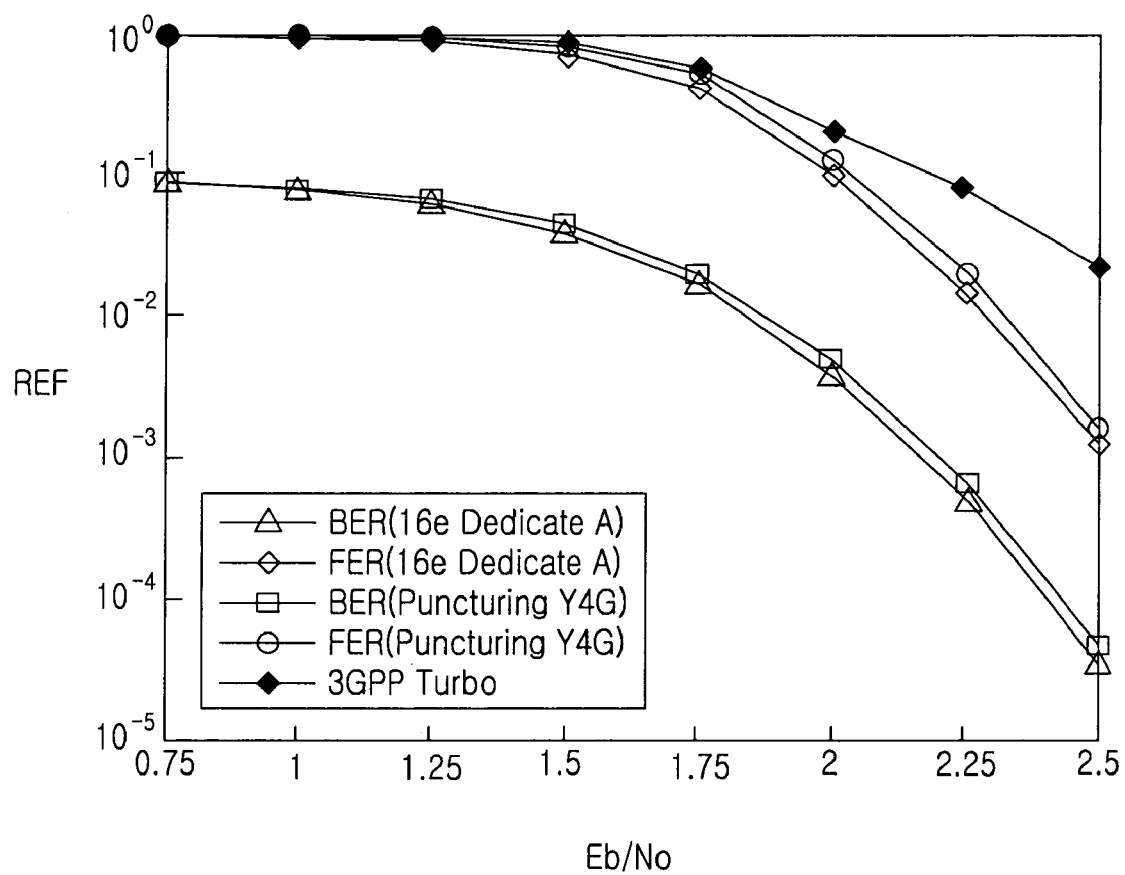
FIG. 7 is a graph illustrating performance simulation results of an LDPC code puncturing method according to the puncturing pattern of FIG. 6.

FIG. 7 is a graph illustrating performance simulation results of an LDPC code puncturing method according to the puncturing pattern of FIG. 6.

A performance of a code with a code rate 2/3 made by a puncturing technique at a code rate 1/2 was compared with that of a code (Dedicate A) of IEEE 802.16e designed at the code rate 2/3. The performances were compared using a frame length of 1728 at a frame error rate in a Gaussian noise environment. As illustrated in FIG. 6, it can be seen that an error-floor does not appear in a punctured code, a performance difference relative to a dedicated code is within 0.025 dB, and performance degradation is almost absent. In a comparison with a turbo code of a code rate 2/3 adopted in the 3rd Generation Partnership Project (3GPP) standard, a gain of more than 0.25 dB is obtained at a frame error rate of $10^{-3}$.

Figure 8:
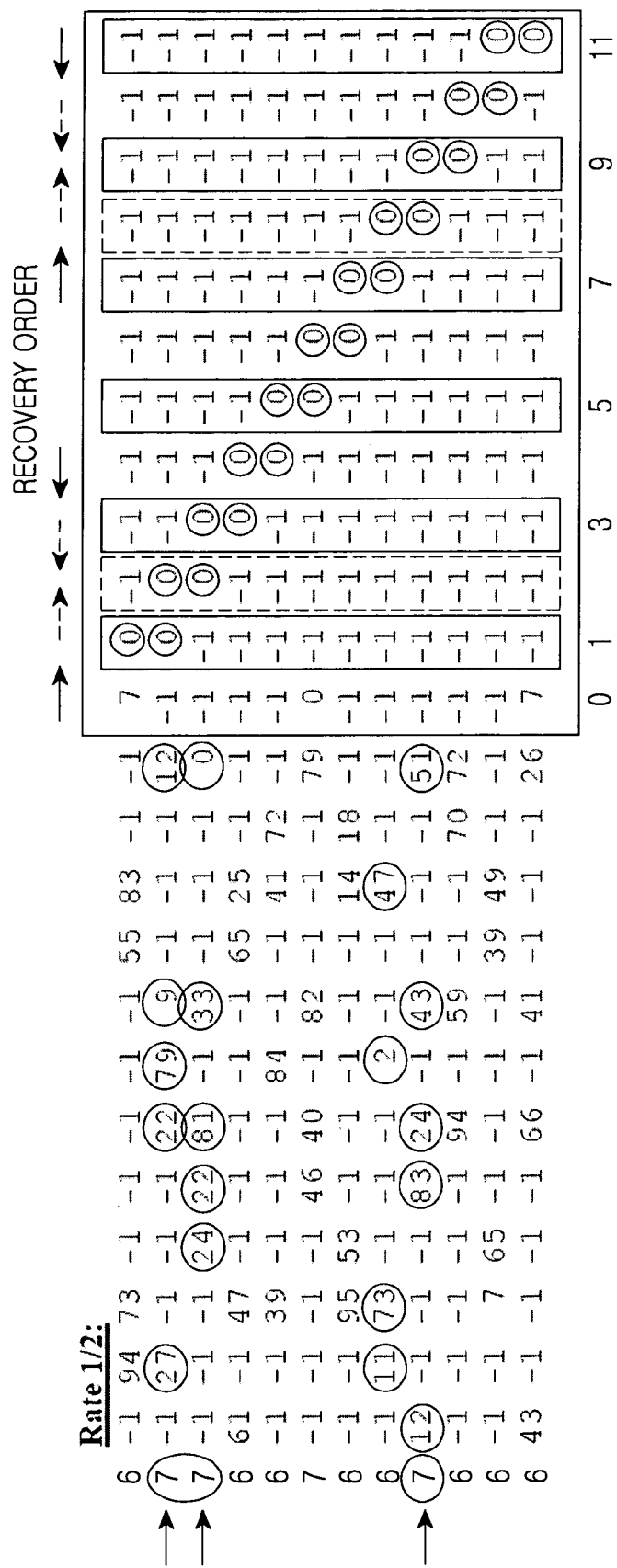
FIG. 8 is a graph illustrating a puncturing pattern at a code rate 3/4 for an LDPC code (Dedicate A) designed at a code rate 1/2 in accordance with the present invention.

FIG. 8 is a graph illustrating a puncturing pattern at a code rate 3/4 for an LDPC code (Dedicate A) designed at a code rate 1/2 in accordance with the present invention.

The puncturing pattern from the code rate 1/2 to the code rate 3/4 is illustrated on a parity check matrix. In a state in which a puncturing process from the code rate 1/2 to the code rate 2/3 has been performed, two blocks are to be further punctured such that the code rate 3/4 can be obtained. Because a stopping set becomes a total parity block in the dual diagonal form, the set of punctured bit nodes do not include the stopping set up to code rate 1. In a state in which two blocks are to be further punctured, criterion of uniformity cannot be applied. In this case, It is best to puncture a parity node capable of receiving information from a largest number of systematic bit nodes, i.e., a bit node block connected to a check node with the highest degree (this can be done by EMD criterion implicitly). The fastest puncturing-related bit update and the most precise puncturing-related bit update are important factors for a superior performance.

Figure 9:
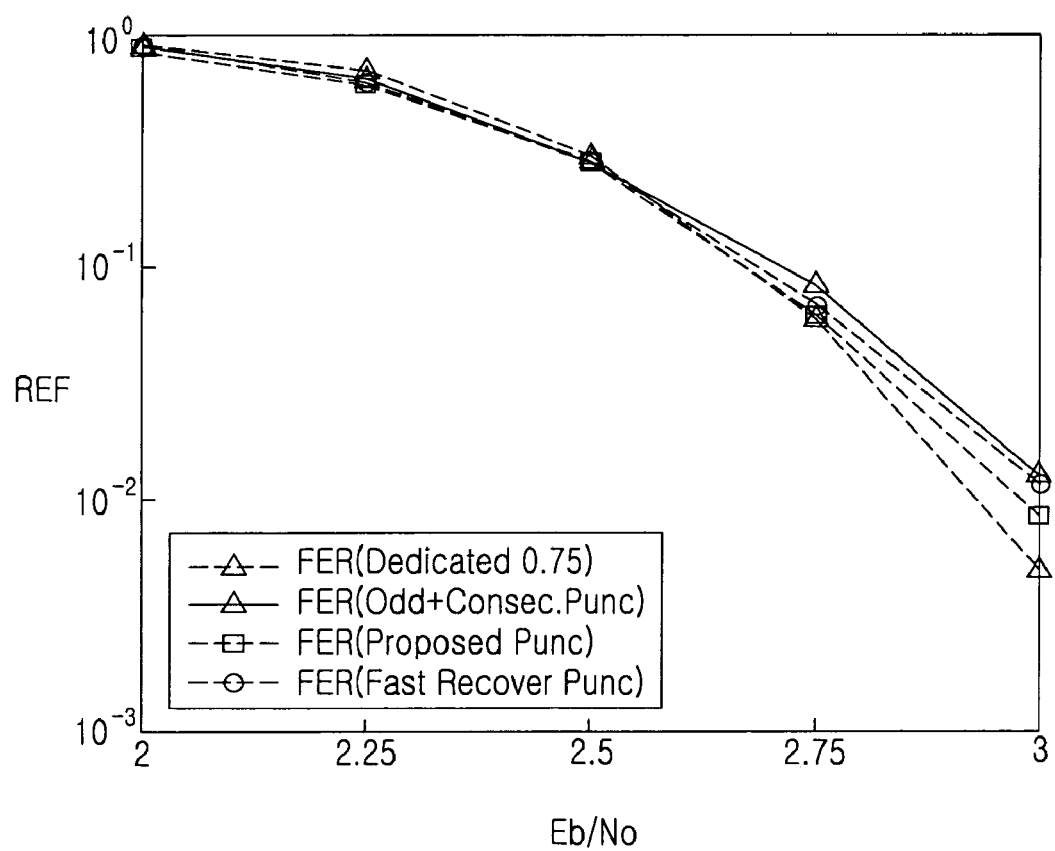
FIG. 9 is a graph illustrating performance simulation results of an LDPC code puncturing method according to the puncturing pattern of FIG. 8.

FIG. 9 is a graph illustrating performance simulation results of an LDPC code puncturing method according to the puncturing pattern of FIG. 8.

FIG. 9 illustrates a comparison with puncturing patterns other than the puncturing pattern of the present invention when a puncturing process from a code rate 1/2 to a code rate 3/4 is to be performed and two blocks are to be further punctured after a half part of a parity block is punctured at up to a code rate 2/3. The excellence of this algorithm can be verified by additionally testing a puncturing method in which two blocks are consecutively filled subsequent to a previous block and a puncturing method in which a block activated for the fastest puncturing-related bit update is equally distributed over a total of parity bits. FIG. 9 illustrates simulation results of all cases including a designated code with a code rate 3/4. A used code is a code with the code rate 1/2 of IEEE 802.16e and a codeword length of 2304, and 768 bits are punctured. Similarly, the dedicated code has the code rate 3/4 of IEEE 802.16e under the same conditions. The performance relative to the dedicated code is superior to that of a puncturing pattern based on the algorithm of the present invention. The performance of a puncturing pattern based on the algorithm of the present invention is superior to that of an algorithm requiring only the fast puncturing-related bit update. The algorithm requiring only the fast puncturing-related bit update outperforms an algorithm for performing puncturing consecutively from the first position. As a result, it can be seen that the fastest puncturing-related bit update and the most precise puncturing-related bit update are important factors for preventing performance degradation due to puncturing.

As described above, the LDPC code puncturing method of the present invention not only can utilize any LDPC code as an powerful code compatible with a higher code rate, but also can improve the efficiency and performance of a system using the H-ARQ or Adaptive Modulation and Coding (AMC) technology, regardless of a type and length of the LDPC code and the number of punctured bits.

The puncturing method of the present invention performs a puncturing process in a uniform puncturing pattern in a point of view of a check node when a decoding process is performed in a belief propagation algorithm, thereby quickly and precisely recovering the reliability of punctured bits.

Moreover, the puncturing method of the present invention updates the reliability on the basis of a large number of other independent bits, uniformly distributes information within a total code block, and performs puncturing while avoiding a stopping set. Therefore, the present invention can prevent the reliability from being biased, thereby obtaining the superior performance.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for puncturing a Low Density Parity Check (LDPC) code that is expressed in a factor graph configured by a bit node and a check node connected to an edge and is configured in a systematic region and a parity region, comprising the steps of:
   a) setting a codeword length and the total number of bit nodes to be punctured;
   b) selecting a check node (or check nodes) with highest priority excluding check nodes completely checked in a current round;
   c) selecting a bit node (or bit nodes) with a highest priority excluding bit nodes completely checked among bit nodes connected to the selected check node (or check nodes);
   d) determining whether the selected bit node is a bit node to be punctured, that is, it is not systematic, not set by a puncturing prohibition flag;
   e) puncturing an associated bit node if the selected bit node is the bit node to be punctured, setting unpunctured bit nodes connected to the selected check node by a puncturing prohibition flag, decreasing the number of remained bit nodes to be punctured by 1 and increasing the number of connected punctured node of associated check node by 1;
   f) determining whether the number of remaining bits to be punctured is greater than 0; and
   g) returning to step b) if the number of remaining bits to be punctured is greater than 0, and ending a puncturing process if the number of remaining bits to be punctured is not greater than 0.

2. The method of claim 1, wherein step c) comprises:
   c-1) selecting a bit node (or bit nodes) with the least degree among the bit nodes connected to the selected check node;
   c-2) selecting a bit node (or bit nodes) with the least sum of each number of punctured nodes of connected check nodes among the bit nodes selected in step c-1); and
   c-3) selecting a bit node (or bit nodes) with the greatest value of EMD values among the bit nodes selected in step c-2).

3. The method of claim 1, wherein step b) comprises:
   b-1) selecting a check node (or check nodes) with the greatest number of connected punctured bit nodes;
   b-2) determining whether the number of bit nodes to be punctured is less than a half of the number of total parity bits;
   b-3) selecting a check node (or check nodes) among check nodes selected in step a) with the greatest Extrinsic Message Degree (EMD) of connected unpunctured bit nodes if the condition of step b-2) is satisfied;
   b-4) selecting a check node (or check nodes) among the check nodes selected in step b-3) with the least degree of connected unpunctured bit nodes; and b-5) selecting a check node (or check nodes) among the check nodes selected in step b-4) with the greatest number of connected unpunctured bit nodes.

4. The method of claim 3, wherein step b) further comprises:
b-6) determining whether a round count value is 1 if the condition of step b-2) is not satisfied; and
b-7) selecting a check node with the least index among the check nodes selected in step a) if the condition of step b-6) is satisfied.

5. The method of claim 4, wherein step b) further comprises:
b-8) selecting a check node (or check nodes) with the least number of connected bit nodes set by the puncturing prohibition flag among the check nodes selected in step a) if the condition of step b-6) is not satisfied; and
b-9) selecting a check node (or check nodes) with the greatest number of connected unpunctured bit nodes among the check nodes selected in step b-8).

6. The method of claim 1, wherein step d) comprises:
d-1) determining whether the selected bit node is a systematic bit node; and
d-2) performing step f) if the selected bit node is the systematic bit node.

7. The method of claim 6, wherein step d) further comprises:
d-3) determining whether an associated bit node is set by the puncturing prohibition flag if the selected bit node is not the systematic bit node in step d-1); and
d-4) performing step e) if the puncturing prohibition flag is not set in step d-3).

8. The method of claim 7, wherein step d) further comprises:
d-5) determining whether the sum of each number of bit nodes set by the puncturing prohibition flag of all check node is equal to the sum of each number of unpunctured bit nodes of all check node if the selected bit node is set by the puncturing prohibition flag in step d-3); and
d-6) performing step c) if the sum of each number of bit nodes set by the puncturing prohibition flag of all check node is equal to the sum of each number of unpunctured bit nodes of all check node in step d-5).

9. The method of claim 8, wherein step d) further comprises:
performing step e) the sum of each number of bit nodes set by the puncturing prohibition flag of all check node is not equal to the sum of each number of unpunctured bit nodes of all check node in step d-5).

* * * * *